(12) United States Patent
Lu et al.

(10) Patent No.: US 9,633,999 B1
(45) Date of Patent: Apr. 25, 2017

(54) METHOD AND STRUCTURE FOR SEMICONDUCTOR MID-END-OF-LINE (MEOL) PROCESS

(71) Applicant: Taiwan Semiconductor Manufacturing Company, Ltd., Hsin-Chu (TW)

(72) Inventors: Chih Wei Lu, Hsinchu (TW); Chung-Ju Lee, Hsinchu (TW); Chien-Hua Huang, Miaoli County (TW); Hsiang-Ku Shen, Hsinchu (TW); Zhao-Cheng Chen, New Taipei (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 14/942,678

(22) Filed: Nov. 16, 2015

(51) Int. Cl.
| | |
|---|---|
| *H01L 21/467* | (2006.01) |
| *H01L 27/088* | (2006.01) |
| *H01L 21/768* | (2006.01) |
| *H01L 21/3105* | (2006.01) |
| *H01L 21/8234* | (2006.01) |
| *H01L 27/02* | (2006.01) |

(Continued)

(52) U.S. Cl.
CPC ...... *H01L 27/088* (2013.01); *H01L 21/31055* (2013.01); *H01L 21/467* (2013.01); *H01L 21/7684* (2013.01); *H01L 21/76816* (2013.01); *H01L 21/76877* (2013.01); *H01L 21/823475* (2013.01); *H01L 23/528* (2013.01); *H01L 27/0207* (2013.01); *H01L 29/66515* (2013.01)

(58) Field of Classification Search
CPC ......... H01L 21/28506; H01L 21/30604; H01L 21/311; H01L 21/32051; H01L 21/467; H01L 21/475; H01L 21/76816; H01L 21/7684; H01L 21/76877; H01L 21/823475; H01L 23/528; H01L 23/5286; H01L 27/088; H01L 29/66515
See application file for complete search history.

(56) References Cited

U.S. PATENT DOCUMENTS

| | | | | | |
|---|---|---|---|---|---|
| 6,010,931 | A | * | 1/2000 | Sun | ............... H01L 27/10852 257/E21.648 |
| 6,136,645 | A | * | 10/2000 | Yang | ............... H01L 27/10852 257/E21.648 |

(Continued)

*Primary Examiner* — Stephen W Smoot
(74) *Attorney, Agent, or Firm* — Haynes and Boone, LLP

(57) ABSTRACT

A method of forming a semiconductor device provides a precursor that includes a substrate having first and second regions, wherein the first region includes an insulator and the second region includes source, drain, and channel regions of a transistor. The precursor further includes gate stacks over the insulator, and gate stacks over the channel regions. The precursor further includes a first dielectric layer over the gate stacks. The method further includes partially recessing the first dielectric layer; forming a second dielectric layer over the recessed first dielectric layer; and forming a contact etch stop (CES) layer over the second dielectric layer. In an embodiment, the method further includes forming gate via holes over the gate stacks, forming source and drain (S/D) via holes over the S/D regions, and forming vias in the gate via holes and S/D via holes.

20 Claims, 10 Drawing Sheets

(51) Int. Cl.
*H01L 23/528* (2006.01)
*H01L 29/66* (2006.01)

(56) References Cited

U.S. PATENT DOCUMENTS

| | | | |
|---|---|---|---|
| 6,177,340 B1 * | 1/2001 | Yoo | H01L 21/76816 |
| | | | 257/E21.252 |
| 6,972,242 B2 * | 12/2005 | Lee | H01L 21/76224 |
| | | | 257/647 |
| 7,667,271 B2 | 2/2010 | Yu et al. | |
| 7,910,453 B2 | 3/2011 | Xu et al. | |
| 8,377,779 B1 | 2/2013 | Wang | |
| 8,399,931 B2 | 3/2013 | Liaw et al. | |
| 8,652,894 B2 | 2/2014 | Lin et al. | |
| 8,686,516 B2 | 4/2014 | Chen et al. | |
| 8,716,765 B2 | 5/2014 | Wu et al. | |
| 8,723,272 B2 | 5/2014 | Liu et al. | |
| 8,729,627 B2 | 5/2014 | Cheng et al. | |
| 8,735,993 B2 | 5/2014 | Lo et al. | |
| 8,736,056 B2 | 5/2014 | Lee et al. | |
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 2005/0020021 A1 * | 1/2005 | Fujiwara | H01L 21/3185 |
| | | | 438/303 |
| 2006/0263985 A1 * | 11/2006 | Kang | H01L 21/82381 |
| | | | 438/275 |
| 2007/0267674 A1 * | 11/2007 | Lin | H01L 27/10897 |
| | | | 257/306 |
| 2010/0221889 A1 * | 9/2010 | Youn | H01L 27/10811 |
| | | | 438/396 |
| 2014/0001574 A1 | 1/2014 | Chen et al. | |
| 2014/0035051 A1 * | 2/2014 | Sun | H01L 21/76897 |
| | | | 257/368 |
| 2014/0110755 A1 | 4/2014 | Colinge | |
| 2014/0151812 A1 | 6/2014 | Liaw | |

\* cited by examiner

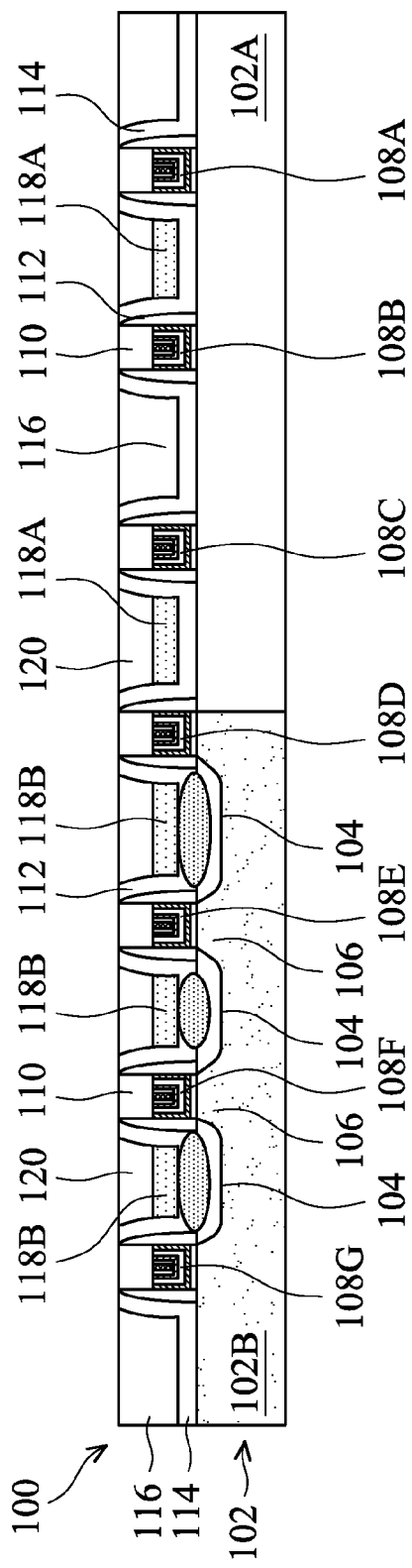
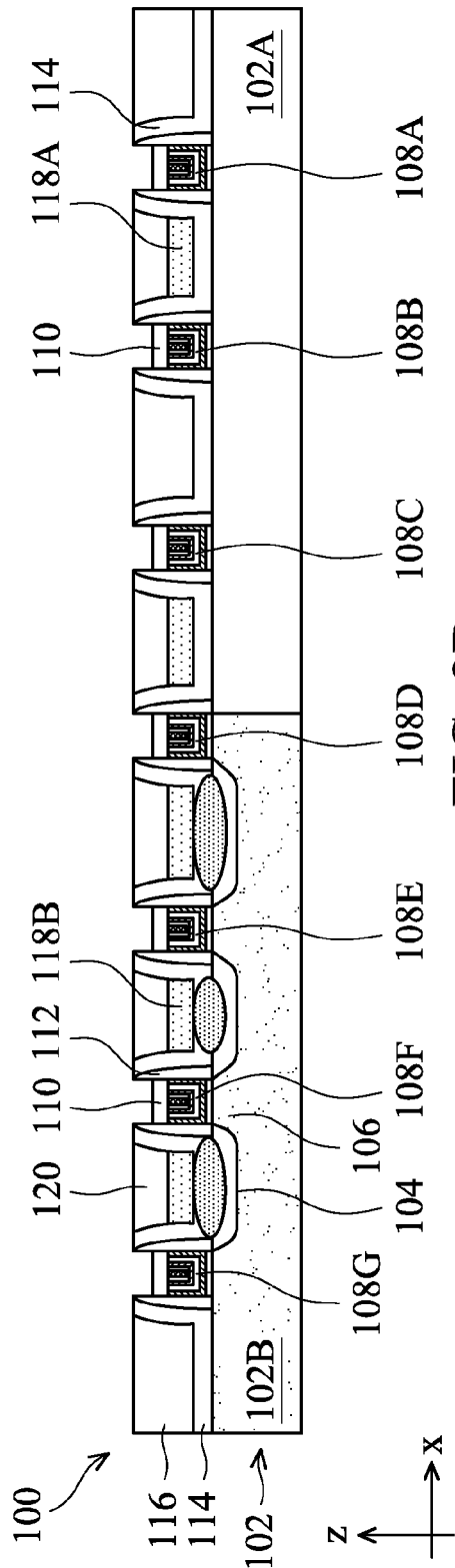
FIG. 2A
FIG. 2B

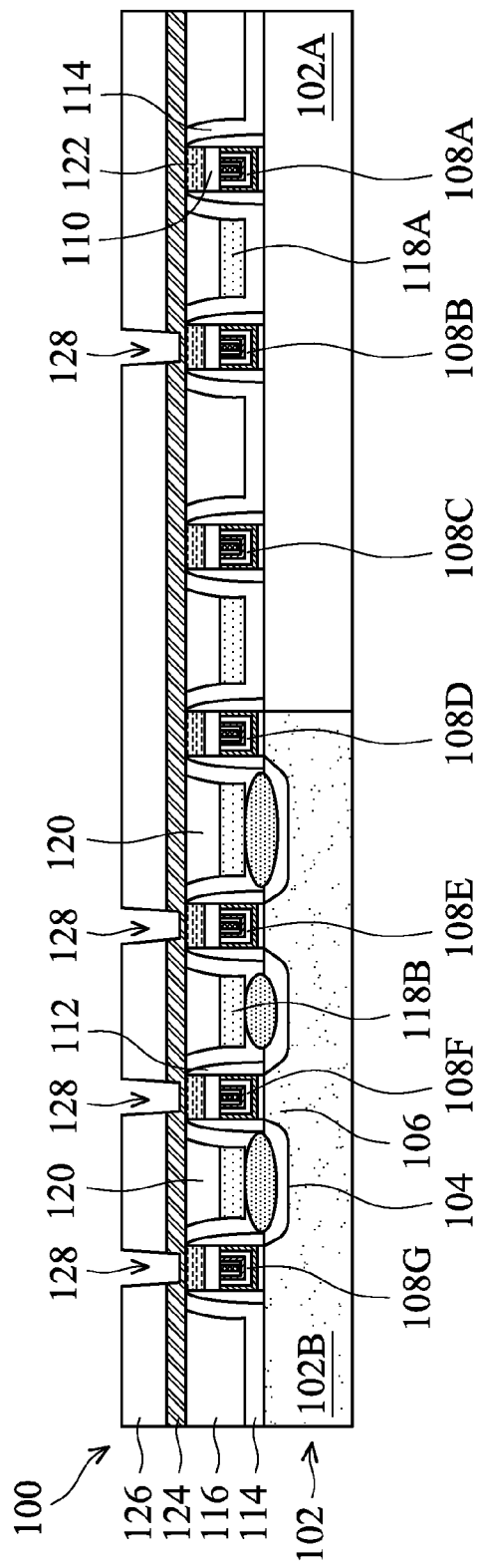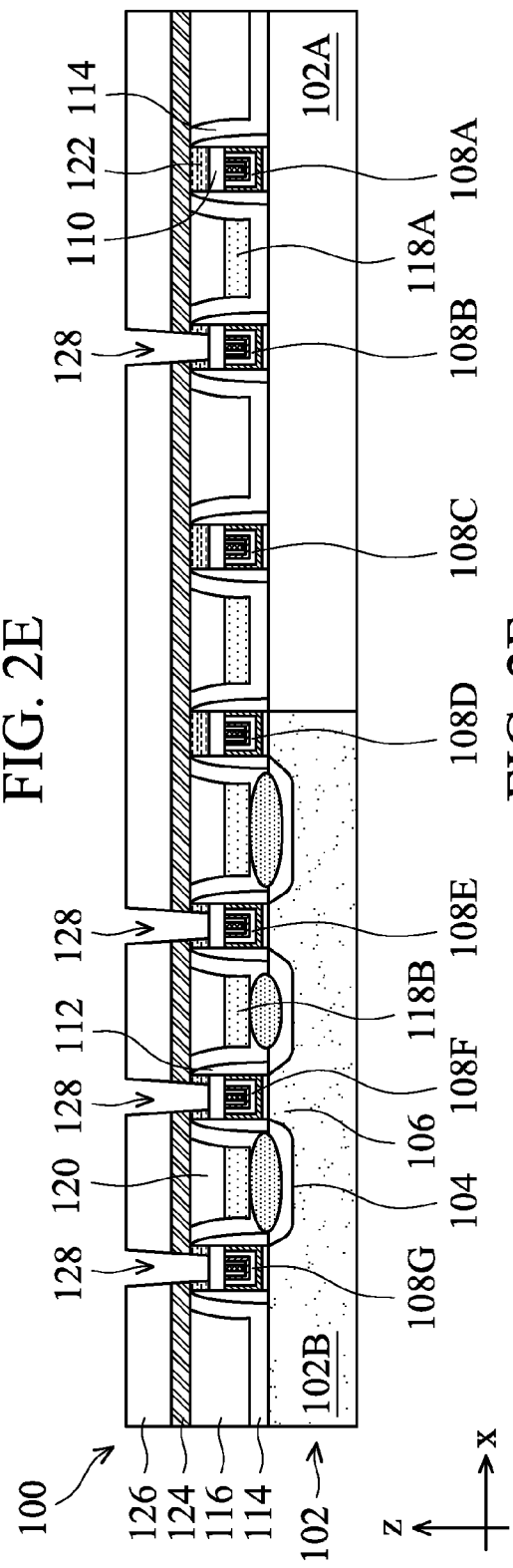
FIG. 2E
FIG. 2F

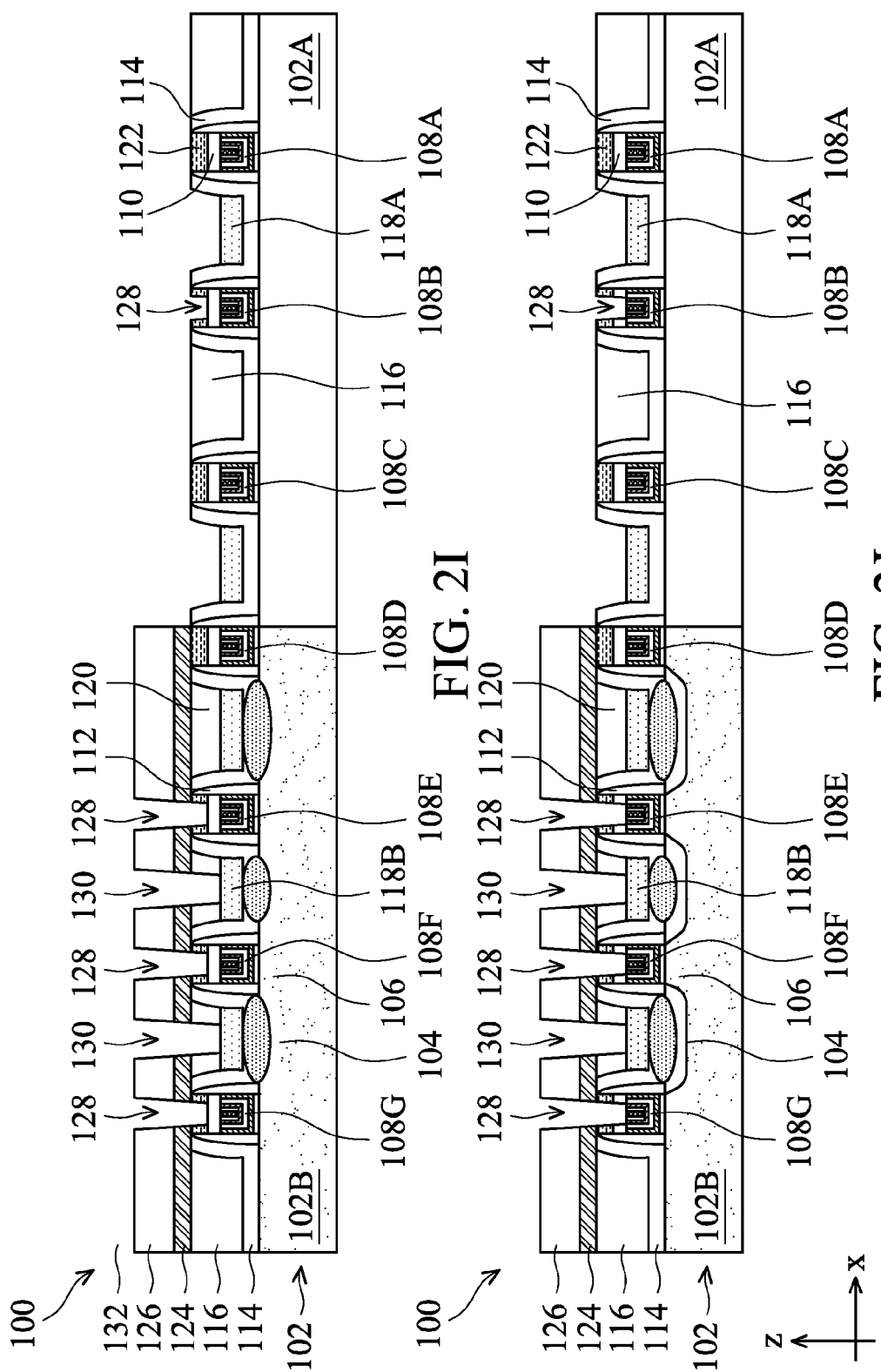

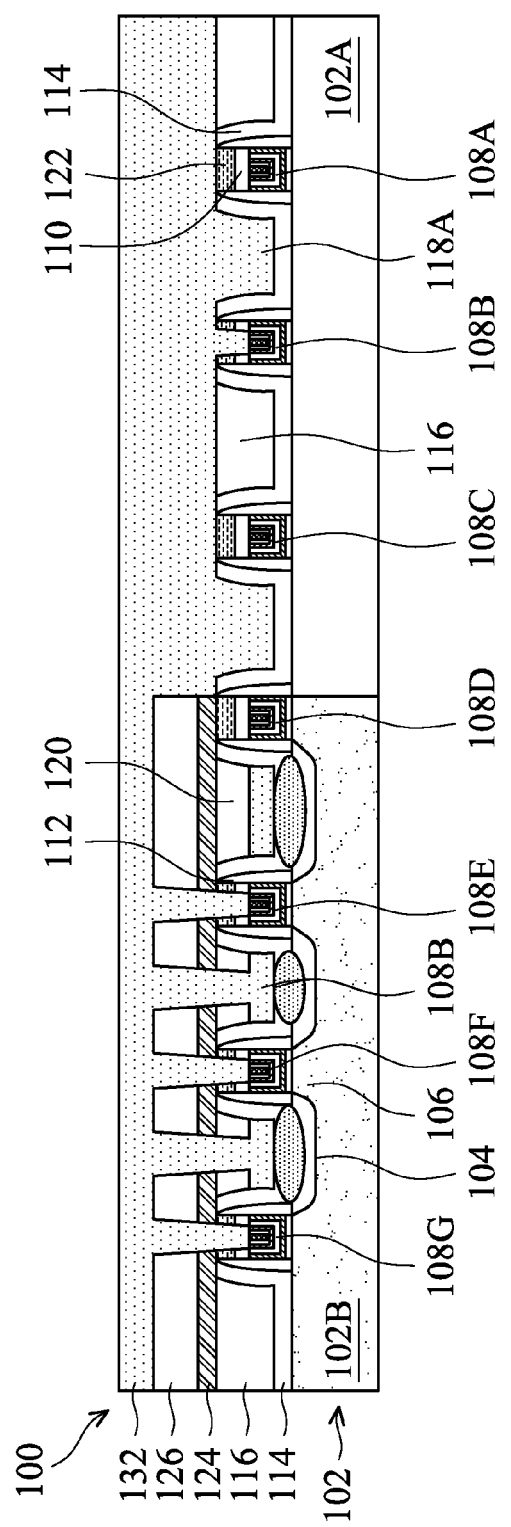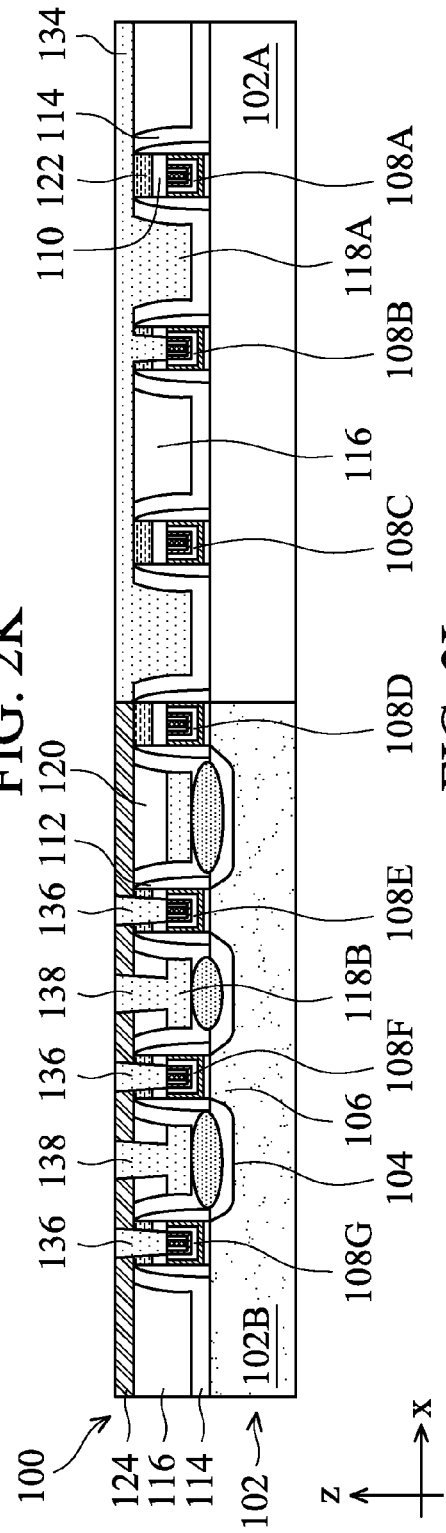

METHOD AND STRUCTURE FOR SEMICONDUCTOR MID-END-OF-LINE (MEOL) PROCESS

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

For example, in the mid-end-of-line (MEOL) processes, it is typical that gate via holes are etched in some areas that have dense vias and in some areas that have isolated vias. It is difficult to control via etching depth in both the dense and isolated via areas when the vias are partially etched. As a result, the via depth varies from one area to another. The via depth variation may cause issues in subsequent fabrication. For example, it may cause a leakage concern when gate contacts and source/drain (S/D) contacts are formed in a later step.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 2A, 2B, 2C, 2D, 2E, 2F, 2G, 2H, 2I, 2J, 2K, and 2L are cross-sectional views of a portion of a semiconductor device constructed according to the method in FIGS. 1A and 1B, in accordance with an embodiment.

DETAILED DESCRIPTION

Figure 1A:
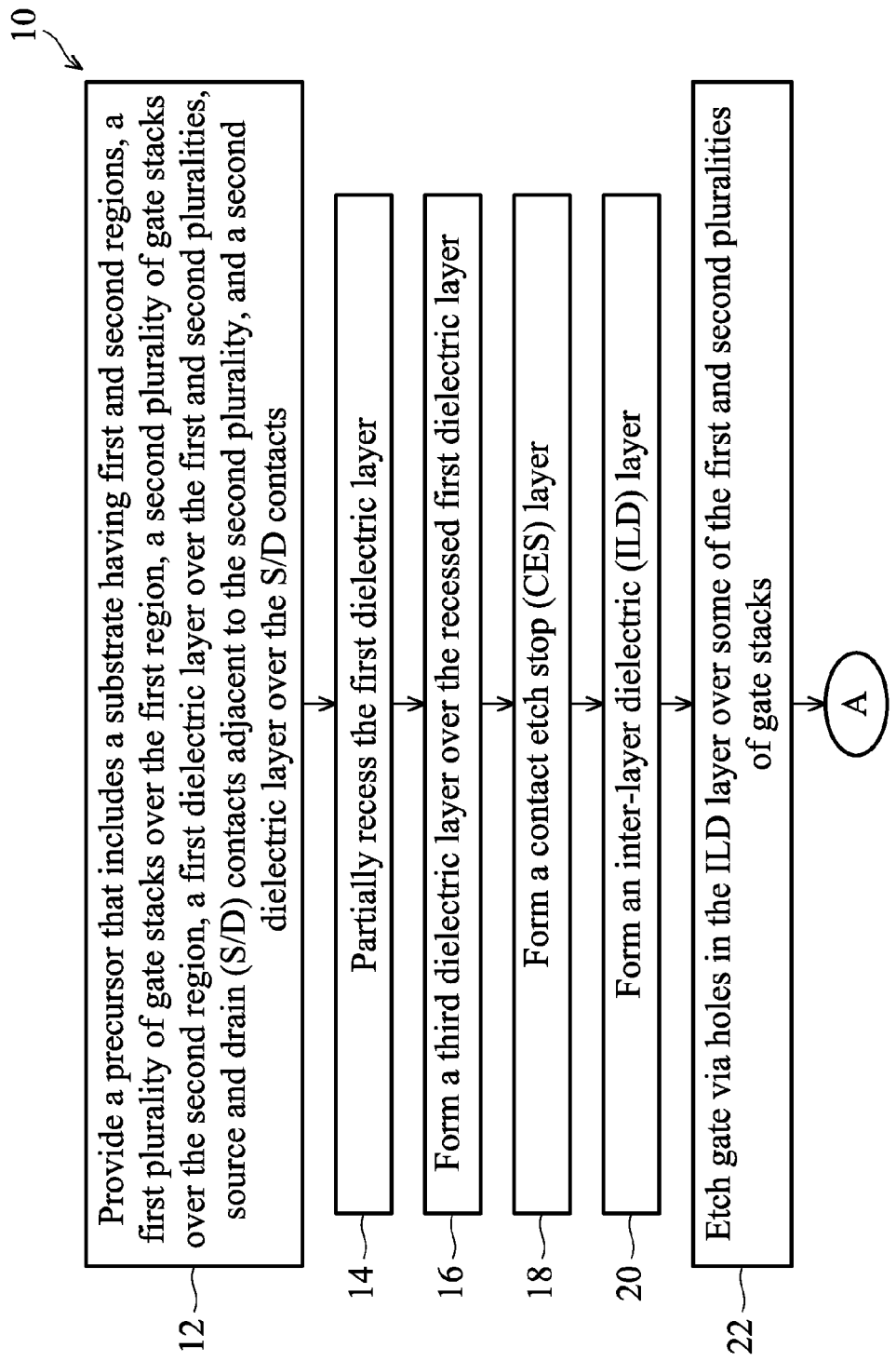
FIGS. 1A and 1B are a flow chart of a method of forming a semiconductor device according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor devices and methods of forming the same. More particularly, the present disclosure is related to MEOL processes in semiconductor manufacturing. One object of the present disclosure is to provide methods and structures for improving the MEOL processes in view of via depth loading issues associated with unevenly distributed vias in different areas of an IC.

Figure 1B:
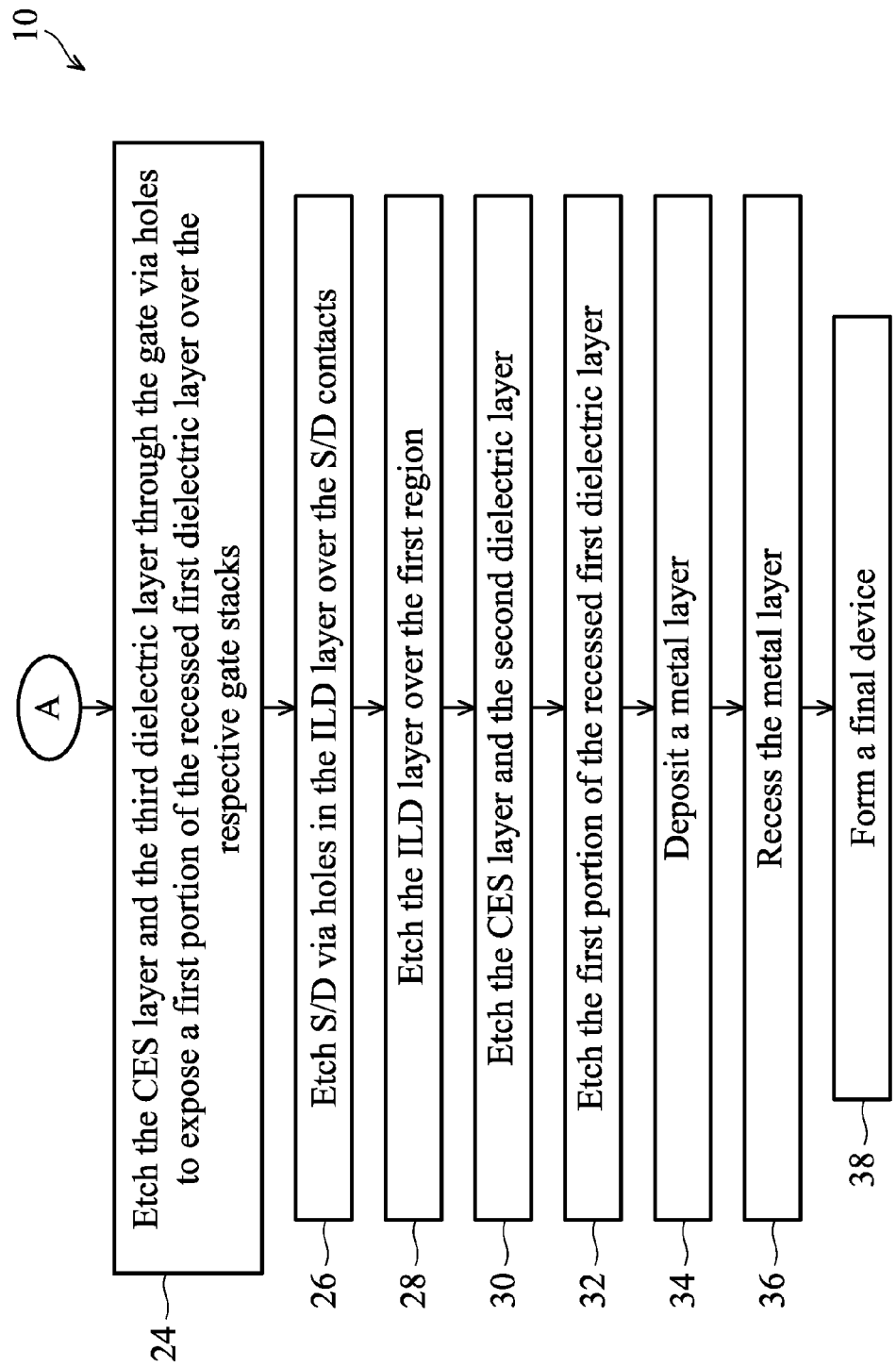

FIGS. 1A and 1B show a flow chart of a method 10 of forming a semiconductor device 100, according to various aspects of the present disclosure. The method 10 is merely an example, and is not intended to limit the present disclosure beyond what is explicitly recited in the claims. Additional operations can be provided before, during, and after the method 10, and some operations described can be replaced, eliminated, or moved around for additional embodiments of the method. The method 10 is described below in conjunction with FIGS. 2A-2L which are cross-sectional views of the semiconductor device 100 in various stages of a manufacturing process.

The semiconductor device 100 is provided for illustration purposes and does not necessarily limit the embodiments of the present disclosure to any number of devices, any number of regions, or any configuration of structures or regions. Furthermore, the semiconductor device 100 as shown in FIGS. 2A-2L may be an intermediate device fabricated during processing of an IC, or a portion thereof, that may comprise static random access memory (SRAM) and/or logic circuits, passive components such as resistors, capacitors, and inductors, and active components such as p-type field effect transistors (PFETs), n-type FETs (NFETs), multi-gate FETs such as FinFETs, metal-oxide semiconductor field effect transistors (MOSFETs), complementary metal-oxide semiconductor (CMOS) transistors, bipolar transistors, high voltage transistors, high frequency transistors, other memory cells, and combinations thereof.

At operation 12, the method 10 (FIG. 1A) provides a precursor of the device 100 as shown in FIG. 2A. For the convenience of discussion, the precursor of the device 100 is also referred to as the device 100. Referring to FIG. 2A, the device 100 includes a substrate 102 and various features formed therein or thereon. The substrate 102 includes two substrate regions 102A and 102B. In the present embodiment, the substrate region 102A includes an insulator such as a shallow trench isolation (STI), while the substrate region 102B includes active regions for forming transistors. In the present embodiment, the two substrate regions 102A and 102B serve for different purposes for the device 100. For example, the substrate region 102A may be used for forming power rails such as voltage supply and/or ground plane, while the substrate region 102B may be used for forming logic circuits. As shown in FIG. 1A, the substrate region 102B includes various source and drain (S/D) regions 104 and channel regions 106 between the S/D regions 104.

Still referring to FIG. 1A, the device 100 further includes a plurality of gate stacks 108A, 108B, 108C, 108D, 108E, 108F, and 108G, wherein the gate stacks 108A-C are disposed over the substrate region 102A, and the gate stacks 108D-G are disposed adjacent to the channel regions 106 in the substrate region 102B. The device 100 further includes a dielectric layer 110 disposed over each gate stack 108A-G, and a gate spacer 112 on sidewalls of each gate stack 108A-G and on sidewalls of the respective dielectric layer 110. In the present embodiment, the device 100 includes a contact etch stop (CES) layer 114 over the substrate 102 and on sidewalls of the gate spacer 112, and further includes an inter-layer dielectric (ILD) layer 116 over the CES layer 114. The device 100 further includes contacts 118A and 118B over the substrate regions 102A and 102B respectively. Over the substrate region 102A, the contacts 118A are disposed over the CES layer 114 between some of the gate stacks (e.g., between the gate stacks 108A and 108B). In the present embodiment, the contacts 118A are used for forming power rails. Therefore, they are also referred to as power contacts 118A. Over the substrate region 102B, the contacts 118B are disposed over the S/D regions 104 and in electrical communication with the respective S/D regions 104. Therefore, they are also referred to as S/D contacts 118B. The device 100 further includes a dielectric layer 120 over the contacts 118A-B. The various features (or components) of the device 100 are further described below.

The substrate 102 is a silicon substrate in the present embodiment. In alternative embodiments, the substrate 102 includes other elementary semiconductors such as germanium; a compound semiconductor such as silicon carbide, gallium arsenide, indium arsenide, and indium phosphide; or an alloy semiconductor, such as silicon germanium carbide, gallium arsenic phosphide, and gallium indium phosphide. In embodiments, the substrate 102 may include silicon on insulator (SOI) substrate, be strained and/or stressed for performance enhancement, include epitaxial regions, include isolation regions, include doped regions, and/or include other suitable features and layers.

The substrate region 102A includes an insulator (or an isolation structure), and may be formed of silicon oxide, silicon nitride, silicon oxynitride, fluoride-doped silicate glass (FSG), a low-k dielectric material, and/or other suitable insulating material. The insulator may be STI features. In an embodiment, the insulator is formed by etching trenches in the substrate 102, filling the trenches with an insulating material, and performing a chemical mechanical planarization (CMP) process to the substrate 102 including the insulating material. The substrate region 102A may include other isolation structure(s) such as field oxide and LOCal Oxidation of Silicon (LOCOS). The substrate region 102A may include a multi-layer isolation structure.

The substrate region 102B may include n-type doped regions and/or p-type doped regions for forming active devices such as transistors. The S/D regions 104 may include heavily doped S/D (HDD), lightly doped S/D (LDD), raised regions, strained regions, epitaxially grown regions, and/or other suitable features. The S/D regions 104 may be formed by etching and epitaxial growth, halo implantation, S/D implantation, S/D activation, and/or other suitable processes. In an embodiment, the S/D regions 104 further include silicidation or germanosilicidation. For example, silicidation may be formed by a process that includes depositing a metal layer, annealing the metal layer such that the metal layer is able to react with silicon to form silicide, and then removing the non-reacted metal layer. In an embodiment, the substrate region 102B includes fin-like active regions for forming multi-gate FETs such as FinFETs. To further this embodiment, the S/D regions 104 and the channel regions 106 may be formed in or on the fins. The channel regions 106 are sandwiched between a pair of S/D regions 104. The channel region 106 conducts currents between the respective S/D regions 104 when the semiconductor device 100 is in use.

Each of the gate stacks 108A-G may be a multi-layer structure. Further, the gate stacks 108A-G may have the same or different structures and materials among them. The following description applies to any one of the gate stacks 108A-G. In an embodiment, the gate stacks 108A-G include an interfacial layer and a polysilicon (or poly) layer over the interfacial layer. In some embodiments, the gate stacks 108A-G may further include a gate dielectric layer and a metal gate layer disposed between the interfacial layer and the poly layer. In some embodiments, the gate stacks 108A-G include one or more metal layers in place of the poly layer. In various embodiments, the interfacial layer may include a dielectric material such as silicon oxide ($SiO_2$) or silicon oxynitride (SiON), and may be formed by chemical oxidation, thermal oxidation, atomic layer deposition (ALD), chemical vapor deposition (CVD), and/or other suitable methods. The poly layer can be formed by suitable deposition processes such as low-pressure chemical vapor deposition (LPCVD) and plasma-enhanced CVD (PECVD). The gate dielectric layer may include a high-k dielectric layer such as hafnium oxide ($HfO_2$), zirconium oxide ($ZrO_2$), lanthanum oxide ($La_2O_3$), titanium oxide ($TiO_2$), yttrium oxide ($Y_2O_3$), strontium titanate ($SrTiO_3$), other suitable metal-oxides, or combinations thereof; and may be formed by ALD and/or other suitable methods. The metal gate layer may include a p-type work function metal layer or an n-type work function metal layer. The p-type work function metal layer comprises a metal selected from, but not limited to, the group of titanium nitride (TiN), tantalum nitride (TaN), ruthenium (Ru), molybdenum (Mo), tungsten (W), platinum (Pt), or combinations thereof. The n-type work function metal layer comprises a metal selected from, but not limited to, the group of titanium (Ti), aluminum (Al), tantalum carbide (TaC), tantalum carbide nitride (TaCN), tantalum silicon nitride (TaSiN), or combinations thereof. The p-type or n-type work function metal layer may include a plurality of layers and may be deposited by CVD, PVD, and/or other suitable process. The one or more metal layers may include aluminum (Al), tungsten (W), cobalt (Co), copper (Cu), and/or other suitable materials, and may be formed by CVD, PVD, plating, and/or other suitable processes. The gate stacks 108A-G may be formed in a gate-first process or a gate-last process (i.e., a replacement gate process).

The dielectric layer 110 is disposed over the gate stacks 108A-G. In an embodiment, the dielectric layer 110 includes a metal oxide, a metal nitride, or other suitable dielectric materials. For example, the metal oxide may be titanium oxide ($TiO_2$), aluminum oxide ($Al_2O_3$), or other metal oxides. For example, the metal nitride may be titanium nitride (TiN), aluminum nitride (AlN), aluminum oxynitride (AlON), tantalum nitride (TaN), or other metal nitrides. The dielectric layer 110 may be formed over the gate stacks 108A-G by one or more deposition and etching processes.

The gate spacer 112 may be a single layer or multi-layer structure. In an embodiment, the gate spacer 112 includes a low-k (e.g., k<7) dielectric material. In some embodiments, the gate spacer 112 includes a dielectric material, such as silicon oxide ($SiO_2$), silicon nitride (SiN), silicon oxynitride (SiON), other dielectric material, or combination thereof. In an example, the gate spacer 112 is formed by blanket depositing a first dielectric layer (e.g., a $SiO_2$ layer having a uniform thickness) as a liner layer over the device 100 and a second dielectric layer (e.g., a SiN layer) as a main D-shaped spacer over the first dielectric layer, and then, anisotropically etching to remove portions of the dielectric layers to form the gate spacer 112. In the present embodiment, the gate spacer 112 is disposed on sidewalls of the gate stacks 108A-G and on sidewalls of the dielectric layer 110.

The CES layer 114 may include a dielectric material such as silicon nitride (SiN), silicon oxide ($SiO_2$), silicon oxynitride (SiON), and/or other materials. The CES layer 114 may be formed by PECVD process and/or other suitable deposition or oxidation processes. The ILD layer 116 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 116 may be deposited by a PECVD process, a flowable CVD (FCVD) process, or other suitable deposition technique. In an embodiment, the CES layer 114 is deposited as a blanket layer over the substrate 102 covering various structures thereon, and the ILD layer 116 is deposited over the CES layer 114. Subsequently, portions of the ILD layer 116 and the CES layer 114 are etched back to form trenches for depositing the contacts 118A-B. Over the substrate region 102A, portions of the ILD layer 116 are etched (e.g., between the gate stacks 108A and 108B) until the CES layer 114 is exposed. As a result, portions of the CES layer 114 remain over the substrate region 102A between adjacent gate spacers 112. Over the substrate region 102B, portions of the ILD layer 116 and the CES layer 114 are etched (e.g., between the gate stacks 108E and 108F) to expose the S/D regions 104 underneath.

The contacts 118A-B are separated by the structures including the respective gate stacks 108A-G, the gate spacer 112, and the CES layer 114. In an embodiment, the contacts 118A-B include a metal such as aluminum (Al), tungsten (W), copper (Cu), cobalt (Co), combinations thereof, or other suitable conductive material. In an embodiment, the contact metal is deposited using a suitable process, such as CVD, PVD, plating, and/or other suitable processes. After the contact metal is deposited, it may be etched back to leave room for depositing the dielectric layer 120.

The dielectric layer 120 may include a metal oxide (e.g., $TiO_2$ and $Al_2O_3$), a metal nitride (e.g., TiN, AlN, AlON, and TaN), or other suitable dielectric materials. In various embodiments, the dielectric layers 110 and 120 may be of the same or different materials. The dielectric layer 120 may be deposited using PVD, CVD, or other deposition methods. In an embodiment, after the dielectric layer 120 is deposited, a CMP process is performed to planarize a top surface the device 100. As a result, top surfaces of the various layers, 110, 112, 114, 116, and 120, become co-planar.

At operation 14, the method 10 (FIG. 1A) partially recesses the dielectric layer 110. Referring to FIG. 2B, the dielectric layer 110 over each of the gate stacks 108A-G is recessed. In an embodiment, the operation 14 includes an etching process that is tuned to etch the dielectric layer 110 while the other layers, 112, 114, 116, and 120, remain substantially unchanged in the etching process. In embodiments, the operation 14 may use a dry etching, a wet etching, or other suitable etching processes. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant.

Figure 2C:
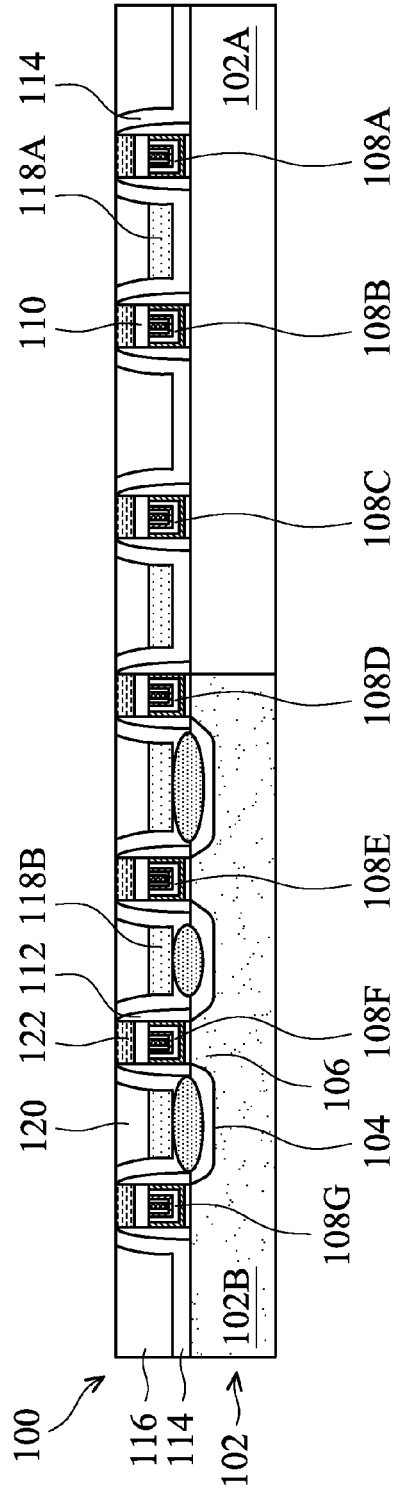
Figure 3:
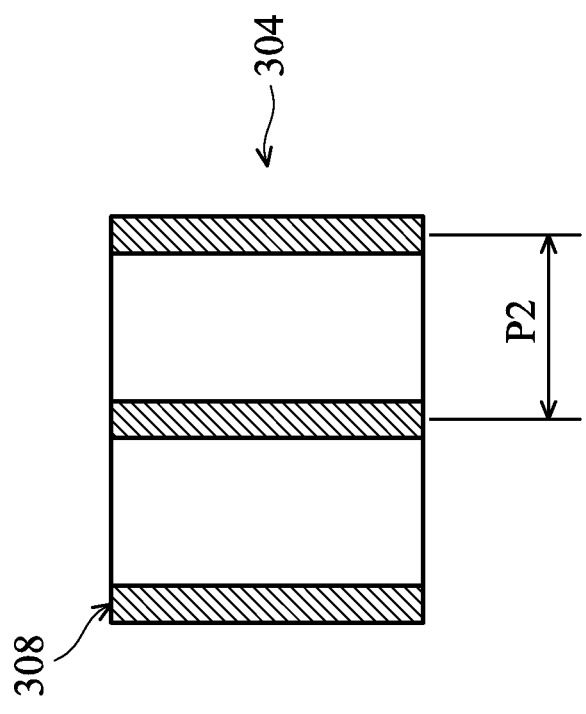
FIG. 3 illustrates areas of an IC that have different gate pitches.
Figure 3:
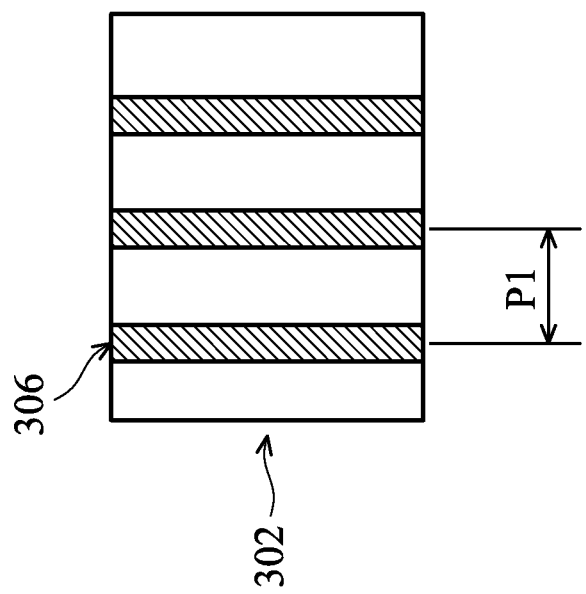

In an embodiment, there are different gate pitches (or gate densities) in different areas (or portions) of the device 100. Some examples are illustrated in FIG. 3 as a top view of two areas 302 and 304 of the device 100. Referring to FIG. 3, the area 302 includes gate stacks 306 having a gate pitch P1 and the area 304 includes gate stacks 308 having a gate pitch P2 that is greater than P1. The gate pitches P1 and P2 may be given as center-line to center-line pitches (as shown) or edge to edge pitches. As illustrated, the area 302 has a smaller gate pitch, hence a higher gate density, than the area 304. In embodiments, the substrate regions 102A and 102B may correspond to areas of the device 100 that have the same or different gate pitches. For example, the substrate region 102A may correspond to a higher gate pitch area and the substrate region 102B may correspond to a lower gate pitch area, or vice versa. When the dielectric layer 110 is partially etched (FIG. 2B), which is usually controlled by a timer, the different gate pitches in different areas of the device 100 create different etch loadings. As a result, the dielectric layer 110 is etched more (or deeper) in some areas and less (or shallower) in some other areas. In the present embodiment, another dielectric layer will be formed over the recessed dielectric layer 110, as will be discussed below. Therefore, the different thicknesses of the recessed dielectric layer 110 will not cause issues for subsequent manufacturing processes. In the present embodiment, the operation 14 may reduce a thickness of the dielectric layer 110 by about 10% to about 90%, which provides a broad process window.

At operation 16, the method 10 (FIG. 1A) forms a dielectric layer 122 over the recessed dielectric layer 110. Referring to FIG. 2C, the dielectric layer 122 is disposed over the recessed dielectric layer 110 over each of the gate stacks 108A-G. In an embodiment, the operation 16 includes depositing a dielectric material over the device 100 and filling in the trenches, followed by a CMP process to remove excessive dielectric materials. Due to the different thicknesses of the recessed dielectric layer 110 as discussed above, the dielectric layer 122 may have different thicknesses over different gate stacks. For example, the dielectric layer 122 over the gate stacks 108A and 108D may be of different thicknesses. The dielectric layer 122 may include a metal oxide, a metal nitride, or other suitable dielectric materials. For example, the metal oxide may be $TiO_2$, $Al_2O_3$, or other metal oxides. For example, the metal nitride may be TiN, AlN, AlON, TaN, or other metal nitrides. In various embodiments, the dielectric layer 122 includes a material different from that of the dielectric layer 110. The dielectric layer 122 may be formed by ALD, PVD, CVD, spin-on coating, or other suitable deposition methods.

Figure 2D:
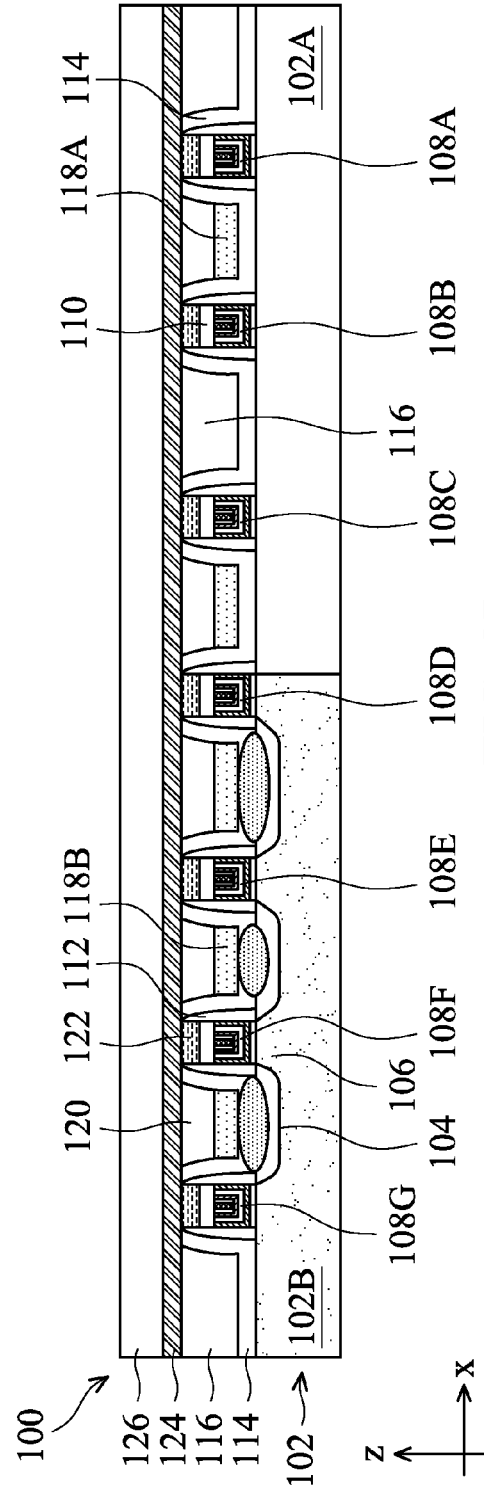

At operation 18, the method 10 (FIG. 1A) forms another CES layer 124 over the various layers 112, 114, 116, 120, and 122. At operation 20, the method 10 (FIG. 1A) forms another ILD layer 126 (also referred to as a patterning layer 126) over the CES layer 124. Referring to FIG. 2D, the CES layer 124 may include a dielectric material such as SiN, $SiO_2$, and SiON. The ILD layer 126 may include an oxide such as TEOS, BPSG, FSG, PSG, and BSG. The ILD layer 126 and the CES layer 124 may include the same materials as the ILD layer 116 and the CES layer 114 respectively, or include different materials. Furthermore, in the present embodiment, the CES layer 124 may include the same material as the dielectric layer 110 and/or the dielectric layer 120. The CES layer 124 may be formed by a PECVD process or other suitable deposition or oxidation processes. The ILD layer 126 may be deposited by a PECVD process, a FCVD process, or other suitable deposition processes.

At operation 22, the method 10 (FIG. 1A) etches the ILD layer 126 to form gate via holes 128 over some of the gate stacks 108A-G. Referring to FIG. 2E, gate via holes 128 are formed in the ILD layer 126 over the gate stacks 108B, 108E, 108F, and 108G, but not over the gate stacks 108A and 108C in this cross-sectional view. In an embodiment, operation 22 includes a photolithography process and an etching process. The photolithography process may include forming a photoresist (or resist) over the ILD layer 126, exposing the resist to a pattern that defines various geometrical shapes for the gate via holes 128, performing post-exposure bake processes, and developing the resist to form a masking element including the resist. The masking element, or a derivative thereof, is then used for etching recesses into the ILD layer 126. The masking element (e.g., a patterned resist) is subsequently removed. The etching processes may include one or more dry etching processes, wet etching processes, and other suitable etching techniques. The CES layer 124 has sufficient etch selectivity with respect to the ILD layer 126, and serves as an etch stop in the etching process.

Figure 4:
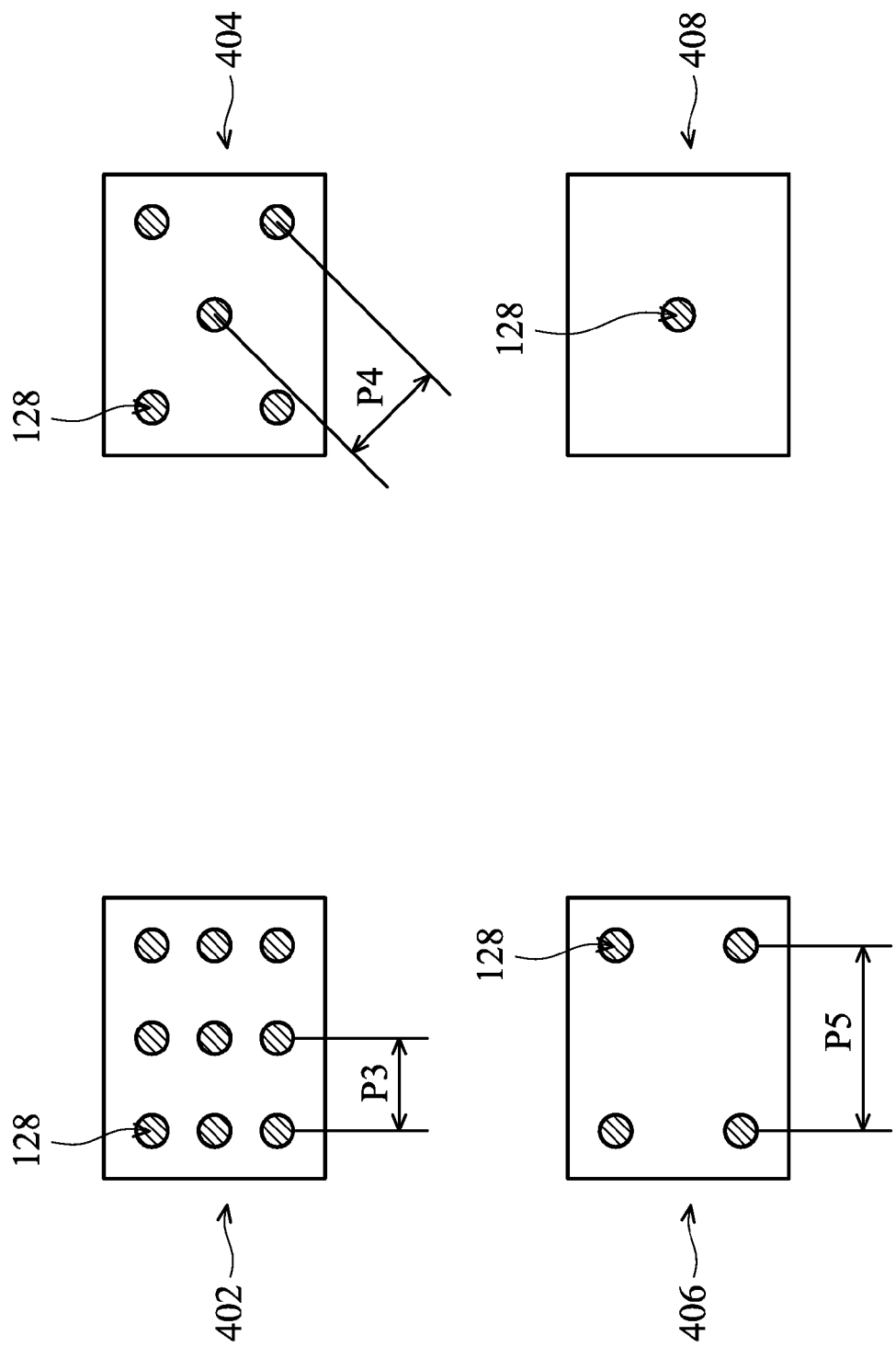
FIG. 4 illustrates areas of an IC that have different via pitches.

Similar to the scenario with different gate pitches discussed above, there may be different gate via pitches in different areas of the device 100. Some examples are illustrated in FIG. 4 as a top view of four areas 402, 404, 406, and 408 of the device 100. Referring to FIG. 4, the area 402 has a gate via pitch P3, the area 404 has a gate via pitch P4 that is greater than P3, the area 406 has a gate via pitch P5 that is greater than P4, and the area 408 has a gate via pitch (not labeled) that is greater than P5. In embodiments, the substrate regions 102A and 102B may each correspond to a dense via area (having a smaller gate via pitch) or an isolated via area (having a greater gate via pitch). However, since the ILD layer 126 is fully etched in the operation 22 and the two layers 126 and 124 have sufficient etch selectivity, the difference in gate via pitches does not create much difference in the structure so formed.

At operation 24, the method 10 (FIG. 1B) etches the CES layer 124 and the dielectric layer 122 through the gate via holes 128, thereby exposing a portion of the recessed dielectric layer 110 over the respective gate stacks 108B, 108E, 108F, and 108G (FIG. 2F). The etching processes may include one or more dry etching processes, wet etching processes, and other suitable etching techniques. In the present embodiment, the operation 24 includes a selective etching process, i.e., an etching process that is tuned to remove the dielectric layer 122 while the dielectric layer 110 remains substantially unchanged in the etching process. As a result, the operation 24 successfully exposes and stops at the recessed dielectric layer 110 over the respective gate stacks, despite that the dielectric layer 122 may be of different thicknesses over the respective gate stacks and/or there may be different via pitches over the substrate regions 102A and 102B.

Figure 2G:
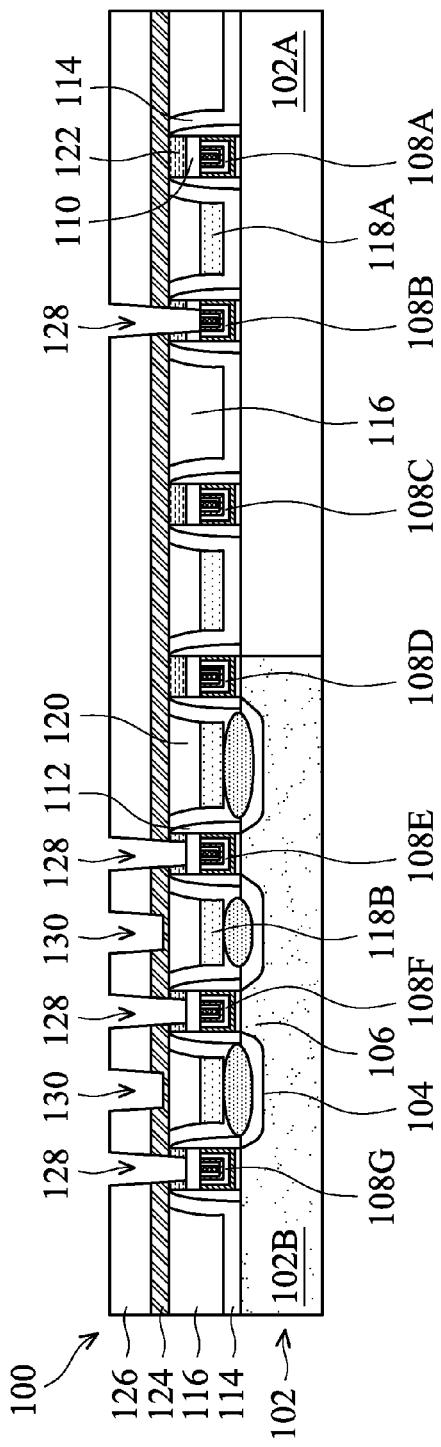

At operation 26, the method 10 (FIG. 1B) etches the ILD layer 126 over some of the S/D contacts 118B to form S/D via holes 130 in the ILD layer 126 (FIG. 2G). In an embodiment, the operation 26 includes a photolithography process and an etching process. For example, the photolithography process forms a masking element (e.g., a patterned resist) over the device 100, which defines the S/D via holes 130; and the etching process etches the ILD layer 126 with the masking element as an etch mask. The etching processes may include one or more dry etching processes, wet etching processes, and other suitable etching techniques. The CES layer 124 has sufficient etch selectivity with respect to the ILD layer 126, and serves as an etch stop in the etching process. The masking element is subsequently removed.

Figure 2H:
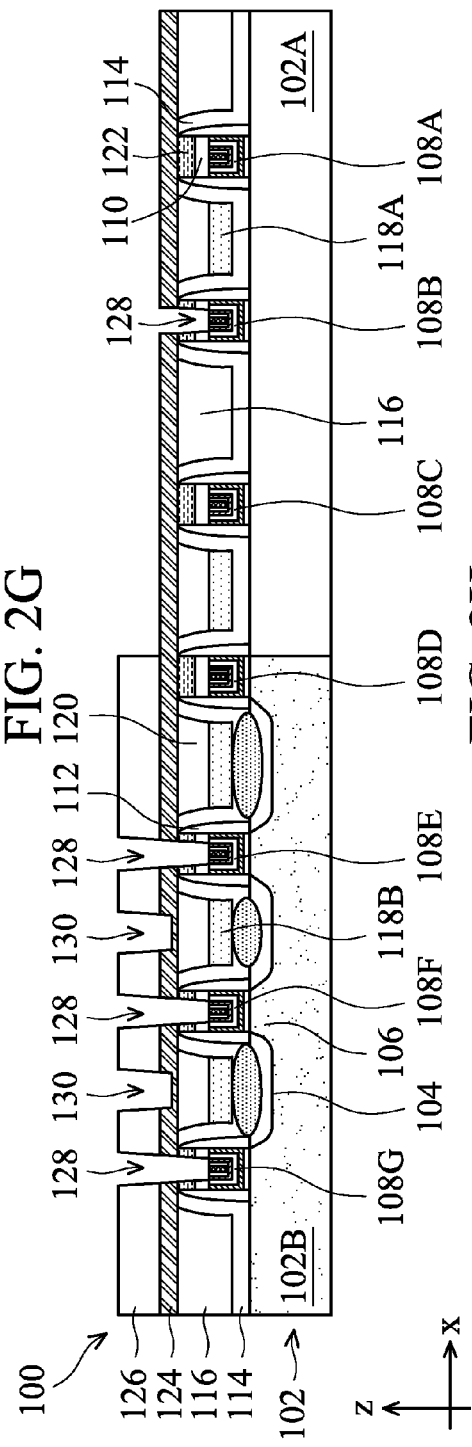

At operation 28, the method 10 (FIG. 1B) etches the ILD layer 126 over the substrate region 102A. Referring to FIG. 2H, in the present embodiment, the operation 28 includes a photolithography process and an etching process. The photolithography process forms a masking element (e.g., a patterned resist) over the device 100, defining trenches for forming power rails over the first substrate region 102A. The etching process etches the ILD layer 126 through the masking element. The etching process may include one or more dry etching processes, wet etching processes, and other suitable etching techniques. The etching process is tuned to remove the ILD layer 126 while the CES layer 124 and the recessed dielectric layer 110 remain substantially unchanged. The masking element is subsequently removed.

At operation 30, the method 10 (FIG. 1B) etches the CES layer 124 and the dielectric layer 120 over the device 100. Referring to FIG. 2I, over the substrate region 102A, the CES layer 124 and the dielectric layer 120 (see FIG. 2H) are etched. The recessed dielectric layer 110 and the dielectric layer 122 protect the gate stacks 108A-C from the etching process. As a result, the power contacts 118A and the ILD layer 116 are exposed. Still referring to FIG. 2I, over the substrate region 102B, the CES layer 124 and the dielectric layer 120 are etched through the S/D via holes 130, thereby exposing the S/D contacts 118B thereunder. The ILD layer 126 and the recessed dielectric layer 110 protect other structures, including the gate stacks 108D-G, from the etching process. The etching process may include one or more dry etching processes, wet etching processes, and other suitable etching techniques.

At operation 32, the method 10 (FIG. 1B) etches the portions of the recessed dielectric layer 110 that are exposed in the gate vias 128. The etching process may include one or more dry etching processes, wet etching processes, and other suitable etching techniques. In the present embodiment, the etching process is tuned to remove the recessed dielectric layer 110 while the dielectric layer 122 remains substantially unchanged. Furthermore, other layers of material, including the gate spacer 112, the CES layers 114 and 124, the ILD layers 116 and 126, and the contacts 118A and 118B, remain substantially unchanged in the etching process in the present embodiment. Referring to FIG. 2J, top surfaces of the gate stacks 108A, 108E, 108F, and 108G are exposed as a result of the etching process, while the gate stacks 108A and 108C are still covered by a stack of the dielectric layer 122 over the recessed dielectric layer 110. In the present embodiment, the dielectric layer 122 serves as a protection layer for the recessed dielectric layer 110. Without the dielectric layer 122, the recessed dielectric layer 110 over the gate stacks 108A and 108C would also be etched in the operation 32. In some cases, the depth of etching is difficult to control in view of different via pitches in different areas of the device 100. Consequently, the gate stacks 108A and 108C might be inadvertently exposed, causing leakage concerns or device defects. In the present embodiment, the dielectric layers 110 and 122 have sufficient etch selectivity such that the recessed dielectric layer 110 over the gate stacks 108B, 108E, 108F, and 108G are fully etched while the gate stacks 108A and 108C remain protected by the dielectric layer 122 over the recessed dielectric layer 110.

At operation 34, the method 10 (FIG. 1B) deposits a metal layer 132 over the device 100, filling in the various trenches and via holes thereon. Referring to FIG. 2K, the metal layer 132 is in electrical communication with: the gate stacks 108A, 108E, 108F, and 108G; the power contacts 118A (between the gate stacks 108A and 108B and between the gate stacks 108C and 108D); and the S/D contacts 118B (between the gate stacks 108E and 108F and between the gate stacks 108F and 108G). The metal layer 132 is electrically isolated from the gate stacks 108A, 108C, and 108D by at least the recessed dielectric layer 110 and the dielectric layer 122. In the present embodiment, the metal layer 132 may include aluminum (Al), tungsten (W), cobalt (Co), copper (Cu), and/or other suitable materials, and may be formed by CVD, PVD, plating, and/or other suitable processes.

At operation 36, the method 10 (FIG. 1B) recesses the metal layer 132. Referring to FIG. 2L, in the present embodiment, the operation 36 also recesses the ILD layer 126 over the substrate region 102B. In an embodiment, the operation 36 includes a CMP process that removes the metal layer 132 and the ILD layer 126 until the CES layer 124 is exposed over the substrate region 102B. As a result, various metal features are formed in the device 100. Over the substrate region 102A, a power rail 134 is formed, which includes a portion of the metal layer 132 and the power contacts 118A. The power rail 134 is in electrical communication with the gate stack 108B, but is electrically isolated from the gate stacks 108A and 108C by at least the dielectric layer 122 and the recessed dielectric layer 110. Over the substrate region 102B, gate vias (or gate plugs) 136 are formed and are electrically connected to the gate stacks 108E, 108F, and 108G; and S/D vias (or S/D plugs) 138 are formed and are electrically connected to the S/D regions 104 through the S/D contacts 118B.

At operation 38, the method 10 (FIG. 1B) proceeds to further steps to complete the fabrication of the device 100. For example, the method 10 may form multi-layer interconnect structure that connects the gate vias 136 and the S/D vias 138 with other parts of the device 100 to form a complete IC.

Although not intended to be limiting, one or more embodiments of the present disclosure provide many benefits to a semiconductor device and a formation process thereof. For example, when forming gate and S/D vias in an MEOL process, embodiments of the present disclosure can reliably connect some, but not all, gate stacks to a power rail, despite of different via pitches (or via densities) in different areas of the semiconductor device. Those gate stacks that are not intended to be connected to the power rail are fully protected by at least two dielectric layers. This prevents power punch-through issues as well as gate and contact leakage issues. The provided subject matter can be easily integrated into existing IC fabrication flow.

In one exemplary aspect, the present disclosure is directed to a method of forming a semiconductor device. The method includes providing a precursor that includes a substrate having first and second regions, wherein the first region includes an insulator and the second region includes source, drain, and channel regions of a transistor. The precursor further includes first and second gate stacks over the insulator; a third gate stack over the channel region; and a first dielectric layer over the first, second, and third gate stacks. The method further includes partially recessing the first dielectric layer, forming a second dielectric layer over the recessed first dielectric layer, and forming a contact etch stop (CES) layer over the second dielectric layer. In an embodiment, the method further includes forming an inter-layer dielectric (ILD) layer over the CES layer, etching first and second holes in the ILD layer over the second and third gate stacks respectively, etching the CES layer and the second dielectric layer through the first and second holes to expose the recessed first dielectric layer over the second and third gate stacks, etching the ILD layer in the first region to expose the CES layer, and etching the CES layer in the first region to expose the second dielectric layer. The method further includes etching the recessed first dielectric layer to expose the second and third gate stacks, while the first gate stack remains covered by the recessed first dielectric layer and the second dielectric layer over the recessed first dielectric layer.

In another exemplary aspect, the present disclosure is directed to a method of forming a semiconductor device. The method includes providing a precursor that includes a substrate having a first region, first and second gate stacks over the first region, and a first dielectric layer over the first and second gate stacks. The method further includes partially recessing the first dielectric layer, forming a second dielectric layer over the recessed first dielectric layer, forming a patterning layer over the second dielectric layer, etching a hole in the patterning layer over the second gate stack, etching a first portion of the second dielectric layer through the hole to expose a first portion of the recessed first dielectric layer, and removing the patterning layer over the first region. The method further includes etching the first portion of the recessed first dielectric layer to expose the second gate stack, while the first gate stack remains covered by a second portion of the recessed first dielectric layer and a second portion of the second dielectric layer.

In yet another exemplary aspect, the present disclosure is directed to a semiconductor device. The semiconductor device includes a substrate having first and second regions, wherein the first region includes an insulator and the second region includes source, drain, and channel regions of a transistor. The semiconductor device further includes first and second gate stacks over the insulator, a third gate stack over the channel region. The semiconductor device further includes a first dielectric layer over the first, second, and third gate stacks; and a second dielectric layer over the first dielectric layer. The semiconductor device further includes a metal layer over the first and second gate stacks, wherein the metal layer is in electrical communication with the second gate stack and is isolated from the first gate stack by at least the first and second dielectric layers.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
   providing a device that includes:
      a substrate having first and second regions, wherein the first region includes an insulator and the second region includes source, drain, and channel regions of a transistor;
      first and second gate stacks over the insulator;
      a third gate stack over the channel region; and
      a first dielectric layer over the first, second, and third gate stacks;
   partially recessing the first dielectric layer, resulting in a recessed first dielectric layer;
   forming a second dielectric layer over the recessed first dielectric layer; and
   forming a contact etch stop (CES) layer over the second dielectric layer.

2. The method of claim 1, further comprising:
   forming an inter-layer dielectric (ILD) layer over the CES layer;
   etching first and second holes in the ILD layer over the second and third gate stacks respectively;
   etching the CES layer and the second dielectric layer through the first and second holes to expose the recessed first dielectric layer over the second and third gate stacks;
   etching the ILD layer in the first region to expose the CES layer;
   etching the CES layer in the first region to expose the second dielectric layer; and
   etching the recessed first dielectric layer to expose the second and third gate stacks, while the first gate stack remains covered by the recessed first dielectric layer and the second dielectric layer over the recessed first dielectric layer.

3. The method of claim 2, wherein the first hole is etched in an area of the semiconductor device that has a smaller gate via pitch than where the second hole is etched.

4. The method of claim 2, wherein the first hole is etched in an area of the semiconductor device that has a greater gate via pitch than where the second hole is etched.

5. The method of claim 2, wherein the etching of the CES layer and the second dielectric layer includes an etching process that is tuned to remove the second dielectric layer while the recessed first dielectric layer remains substantially unchanged.

6. The method of claim 2, wherein the etching of the recessed first dielectric layer includes an etching process that is tuned to remove the recessed first dielectric layer while the second dielectric layer remains substantially unchanged.

7. The method of claim 2, further comprising, before the etching of the ILD layer in the first region:
   etching via holes in the ILD layer over the source and drain (S/D) regions.

8. The method of claim 7, wherein:
   the device further includes:
      S/D contacts over the S/D regions; and
      a third dielectric layer over the S/D contacts; and
      the etching of the CES layer in the first region includes etching the CES layer and
   the third dielectric layer through the via holes to expose the S/D contacts.

9. The method of claim 8, further comprising:
   depositing a metal layer over the first and second regions, wherein the metal layer is in electrical communication with the second and third gate stacks and the S/D contacts, and wherein the metal layer is isolated from the first gate stack by at least the recessed first dielectric layer and the second dielectric layer.

10. The method of claim 9, further comprising:
    performing a chemical mechanical planarization (CMP) process to remove portions of the metal layer and the ILD layer until the CES layer is exposed over the second region.

11. The method of claim 1, wherein the partially recessing of the first dielectric layer reduces a thickness of the first dielectric layer by about 10% to about 90%.

12. A method of forming a semiconductor device, the method comprising:
    providing a device that includes:
       a substrate having a first region;
       first and second gate stacks over the first region; and
       a first dielectric layer over the first and second gate stacks;
    partially recessing the first dielectric layer, resulting in a recessed first dielectric layer;
    forming a second dielectric layer over the recessed first dielectric layer;
    forming a patterning layer over the second dielectric layer;
    etching a hole in the patterning layer over the second gate stack;
    etching a first portion of the second dielectric layer through the hole to expose a first portion of the recessed first dielectric layer;
    removing the patterning layer over the first region; and
    etching the first portion of the recessed first dielectric layer to expose the second gate stack, while the first gate stack remains covered by a second portion of the recessed first dielectric layer and a second portion of the second dielectric layer.

13. The method of claim 12, further comprising:
    forming a metal layer over the first and second gate stacks, wherein the metal layer is in electrical communication with the second gate stack and is isolated from the first gate stack by at least the second portion of the recessed first dielectric layer and the second portion of the second dielectric layer.

14. The method of claim 12, wherein the first and second gate stacks are disposed over an insulator in the first region.

15. The method of claim 12, wherein the etching of the first portion of the second dielectric layer includes an etching process that is tuned to remove the first portion of the second dielectric layer while the first portion of the recessed first dielectric layer remains substantially unchanged.

16. The method of claim 12, wherein the etching of the first portion of the recessed first dielectric layer includes an etching process that is tuned to remove the first portion of the recessed first dielectric layer while the second portion of the second dielectric layer remains substantially unchanged.

17. The method of claim 12, wherein the partially recessing of the first dielectric layer reduces a thickness of the first dielectric layer by about 10% to about 90%.

18. A method, comprising:
    providing a device that includes:
       a substrate having first and second regions;
       first and second gate stacks over an insulator in the first region;
       a third gate stack over an active region in the second region; and
       a first dielectric layer over the first, second, and third gate stacks;

partially recessing the first dielectric layer, resulting in a recessed first dielectric layer;

forming a second dielectric layer over the recessed first dielectric layer;

forming a contact etch stop (CES) layer over the second dielectric layer;

forming an inter-layer dielectric (ILD) layer over the CES layer;

etching holes over the second and third gate stacks through the ILD layer, the CES layer, and the second dielectric layer, thereby exposing the recessed first dielectric layer over the second and third gate stacks;

after the etching of the holes, removing the ILD layer in the first region; and after the removing of the ILD layer in the first region, removing the CES layer in the first region to expose the second dielectric layer over the first gate stack.

19. The method of claim 18, wherein the removing of the ILD layer in the first region further includes:

etching another hole over a source/drain region adjacent the third gate stack, wherein the another hole exposes the CES layer in the second region.

20. The method of claim 19, wherein the removing of the CES layer in the first region further includes:

extending the another hole to expose a contact feature over the source/drain region.

\* \* \* \* \*